United States Patent [19]

Meador et al.

[11] Patent Number: 4,544,416
[45] Date of Patent: Oct. 1, 1985

[54] PASSIVATION OF SILICON OXIDE DURING PHOTORESIST BURNOFF

[75] Inventors: Charles G. Meador; Eddie H. Breashears, both of Lubbock, Tex.

[73] Assignee: Texas Instruments Incorporated, Dallas, Tex.

[21] Appl. No.: 526,742

[22] Filed: Aug. 26, 1983

[51] Int. Cl.[4] .................. H01L 21/306; C23F 1/02
[52] U.S. Cl. .................. 148/1.5; 148/187; 156/643; 156/646
[58] Field of Search ............. 148/1.5, 187; 156/643, 156/646

[56] References Cited

U.S. PATENT DOCUMENTS 3,920,483 11/1975 Johnson, Jr. et al. ............ 148/1.5
4,018,627 4/1977 Polata ........................... 148/1.5
4,201,800 5/1980 Alcorn et al. .................. 156/643
4,374,699 2/1983 Sanders et al. .................. 156/643

OTHER PUBLICATIONS

Rai et al., J. Phys. D, Appl. Phys., vol. 11, (1978), 2139.
Kriegler in Semiconductor Silicon 1973 ed., Huff et al., Princeton, N.J., 1974.
Crimi et al., IBM-TDB, 22, (1980), 4891.
Coburn, IBM-TDB, 20, (1978), 4922.

Primary Examiner—Upendra Roy
Attorney, Agent, or Firm—John G. Graham

[57] ABSTRACT

A method of removal of photoresist in a manufacturing process for semiconductor devices utilizes burnoff in an oxidizing atmosphere. In order to reduce contamination of underlying silicon dioxide layers, chlorine in the atmosphere getters Na+ ions, etc. The chlorine gas is obtained from HCL added to the oxidizing atmosphere.

7 Claims, 2 Drawing Figures

PASSIVATION OF SILICON OXIDE DURING PHOTORESIST BURNOFF

BACKGROUND OF THE INVENTION

This invention relates to manufacture of semiconductor devices, and more particularly to photoresist burnoff methods of the type used in manufacture of VLSI semiconductor memory devices or the like.

In the manufacture of MOS LSI devices such as dynamic RAMs or the like, a number of photolithography operations are performed which require application of, and subsequent removal of, a photoresist polymer. Dry removal processes are preferred to avoid the problems of using wet chemicals such strong acids, base and peroxides. The dry removal process for photoresist consists of a plasma "ash" or oxygen burnoff; mobile ionic contaminants in underlying silicon oxide layers can result from such burnoff, and this invention is concerned with passivation or elimination of such contaminants problems caused by the contaminants including a flat band voltage shift (i.e., shift in the threshold voltage of MOS transistors in the device) under electrical bias, and temperature stress due to re-positioning the contaminants, either causing degradation in performance of the integrated circuit. The problems are more severe with removal of positive photoresists.

It is the principal object of this invention to provide an improved method of making semiconductor integrated circuits such as memory devices or the like. Another object is to provide an improved method of burning off photoresist in manufacture of such devices.

SUMMARY OF THE INVENTION

In accordance with one embodiment of the invention, a method of removal of photoresist in a manufacturing process for semiconductor devices utilizes burnoff in an oxidizing atmosphere. In order to reduce contamination of underlying silicon dioxide layers, chlorine in the atmosphere getters N+ ions, etc. The chlorine gas is obtained from HCL added to the oxidizing atmosphere.

BRIEF DESCRIPTION OF THE DRAWINGS

The novel features believed characteristic of the invention are set forth in the appended claims. The invention itself, however as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
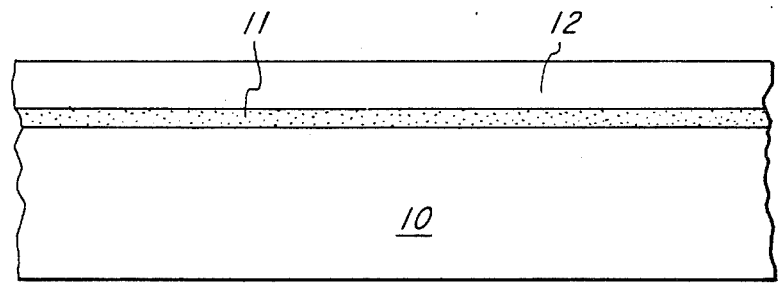
FIGS. 1 and 2 are elevation views in section of a semiconductor device at stages of manufacture thereof, according to the invention.
Figure 2:
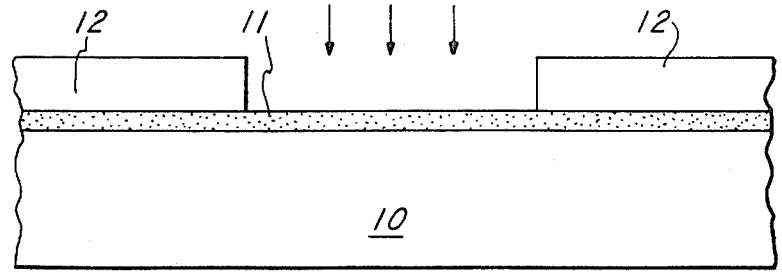

Referring to FIG. 1, the method of the invention is used in the manufacture of semiconductor devices in which a silicon slice 10 has a silicon oxide layer 11 formed thereon, and a coating of photoresist 12 has been applied over the silicon oxide. This sequence of process steps is used repeatedly in manufacture of devices such as dynamic RAMs as set forth in U.S. Pat. No. 4,055,444, issued to G. R. Mohan Rao, U.S. Pat. No. 4,240,092, issued to Kuo, or U.S. Pat. No. 4,239,993, issued to McAlexander, White and Rao, all assigned to Texas Instruments. The photoresist is exposed to ultraviolet light through a mask in order to pattern or define a layer beneath the photoresist. The resist is developed, leaving photoresist in place in some areas and not in others as seen in FIG. 2, so that the photoresist can be used as an etch mask. The slice is subjected to an etchant to accomplish the desired patterning of a layer, and then the next step is removal of the remaining photoresist so that another layer of material such as polysilicon, metal, or oxide can be added, or another photoresist operation performed.

According to the invention, the photoresist 12 of FIG. 2 is removed by burnoff in an oxygen containing atmosphere with gaseous hydrochloric acid introduced. The slice is placed in a tube furnace and brought to a temperature of 400° to 800° C., preferably above about 600° C., and held for at least ten minutes or whatever time is needed to burn off the photoresist. An atmosphere of steam or dry oxygen is maintained in the tube furnace during this time, and HCL is added according to the invention. The HCL and oxygen produces $H_2O$ and $Cl_2$, and the $Cl_2$ will getter the mobile ionic contaminants (Na+, etc.) from the photoresist either by rendering them immobile and neutral within the silicon oxide 11, or by outdiffusing them from the silicon oxide. The slices subjected to this treatment show little if any shift in the threshold voltage of the MOS transistors formed in the slice, or in the threshold voltage for parasitic devices under field oxide. The process requires at least a minimum concentration of chlorine to become effective and improves with increased exposure time, but of course the burn off is held to a minimum to avoid other temperature-induced effects. The chlorine concentration increases with decreasing temperature, whereas the diffusion rates increase with temperature. Tests show that the change in threshold voltage decreases markedly when the percent concentration of HCl is at least about 2%, then gradually decreases up to 30% HCl.

The $Cl_2$ freed from HCL in this burnoff process step functions in one of two ways, or both, to getter contaminants. It diffuses into the silicon oxide 11 and ties up Na+ ions, or the Na+ ions diffuse out of the silicon oxide 11 and react with $Cl_2$.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of manufacture of semiconductor devices comprising the steps of:
   forming a layer of silicon oxide on a face of a semiconductor body,
   applying a coating of photoresist on said face over said layer of silicon oxide,
   exposing and developing said coating of photoresist to define a pattern then performing an operation on said face using such pattern as a mask,
   and thereafter removing the remaining parts of said coating of photoresist by exposing said body to an atmosphere of oxygen and HCl at elevated temperature whereby the oxygen burns off the photoresist and chlorine freed by reaction of oxygen and HCl getters contaminants of the silicon oxide.

2. A method according to claim 1 wherein said semiconductor body is silicon, and said high temperature is at least 400° C.

3. A method according to claim 2 wherein said temperature is no more than about 800° C.

4. A method according to claim 3 wherein the concentration of HCl is at least about 4%.

5. A method according to claim 1 wherein said temperature is in the range of 400° to 800° C. and the concentration of HCl is at least 4%.

6. A method of removing photoresist from a face of a silicon body in manufacture of semiconductor devices, comprising the step of exposing said face to an atmosphere of oxygen and HCl at a temperature in the range of 400° to 800° C. to burn off said photoresist and getter contaminants.

7. A method according to claim 6 wherein the concentration of HCl in said temperature is at least 4%.

* * * * *